United States Patent [19]

Osada et al.

[11] Patent Number: 6,160,078
[45] Date of Patent: Dec. 12, 2000

[54] SEMICONDUCTOR ENCAPSULATING EPOXY RESIN COMPOSITION AND SEMICONDUCTOR DEVICE

[75] Inventors: Shoichi Osada; Toshio Shiobara; Takayuki Aoki; Kazutoshi Tomiyoshi, all of Usui-gun, Japan

[73] Assignee: Shin-Etsu Chemical Co., Ltd., Japan

[21] Appl. No.: 09/189,408

[22] Filed: Nov. 10, 1998

[30] Foreign Application Priority Data

Nov. 11, 1997 [JP] Japan ................................. 9-325226

[51] Int. Cl.$^7$ .................................................. C08G 59/08
[52] U.S. Cl. ........................ 528/104; 523/451; 525/481; 525/489; 525/524; 528/103
[58] Field of Search ........................... 523/451; 525/481, 525/489, 524; 528/103, 104

[56] References Cited

U.S. PATENT DOCUMENTS 3,632,555  1/1972  Harris et al. .
5,418,266  5/1995  Shiobara et al. ........................ 523/443

FOREIGN PATENT DOCUMENTS 158475  6/1998  Japan .
204257  8/1998  Japan .

OTHER PUBLICATIONS

English Abstract of Japan 158475.
English Abstract of Japan 204257.

*Primary Examiner*—Robert Dawson
*Assistant Examiner*—D. Aylward
*Attorney, Agent, or Firm*—Millen, White, Zelano & Branigan, P.C.

[57] ABSTRACT

An epoxy resin composition comprising an epoxy resin of a specific structure, a phenolic resin of a specific structure, and an inorganic filler is suited for semiconductor encapsulation since it is effectively moldable and cures into products having improved flame retardance, reflow crack resistance and dielectric properties.

20 Claims, No Drawings

SEMICONDUCTOR ENCAPSULATING EPOXY RESIN COMPOSITION AND SEMICONDUCTOR DEVICE

BACKGROUND OF THE INVENTION

1. Field of the Invention

This invention relates to an epoxy resin composition for semiconductor encapsulation which cures into a product having improved flame retardance, solder crack resistance and dielectric properties. It also relates to a semiconductor device encapsulated with the composition.

2. Prior Art

With the advance of semiconductor devices toward higher density, surface mount packages have now become the mainstream in semiconductor technology. For the manufacture of surface mount packages, vapor phase reflow, IR reflow and solder immersion steps are often employed. These steps expose surface mount packages to high temperatures of 215 to 260° C. Packages encapsulated with conventional encapsulants have the problem that reliability is not insured because cracks are generated in the encapsulant portion during mounting. As thin packages such as TSOP and TQFP now become predominant, the demand for reflow crack resistance is increasing.

In order to increase the operating speed of a CPU, the clock frequency is increased. It is then desired to use for packages and circuit boards, low dielectric constant materials featuring a low loss of signal transmission.

In encapsulating resin compositions, flame retardants such as halogen compounds and antimony trioxide are often blended. However, halogen flame retardants generate halide ions (or radicals) at elevated temperatures, incurring breakage of gold wires and lowering of heat resistance. From the environmental hygienic standpoint, flame retardant encapsulating materials free of halogen compounds and antimony trioxide are desired.

Therefore, an object of the invention is to provide an epoxy resin composition for semiconductor encapsulation which cures into a product having reliability at elevated temperatures, safety to the environment, improved flame retardance, reflow crack resistance and improved dielectric properties. Another object of the invention is to provide a semiconductor device encapsulated with the composition.

SUMMARY OF THE INVENTION

According to the invention, there is provided a semiconductor encapsulating epoxy resin composition comprising (A) an epoxy resin of the following general formula (1), (B) a phenolic resin of the following general formula (2) as a curing agent, and (C) an inorganic filler. The composition of these essential components cures into a product having improved flame retardance, reflow crack resistance and improved dielectric properties.

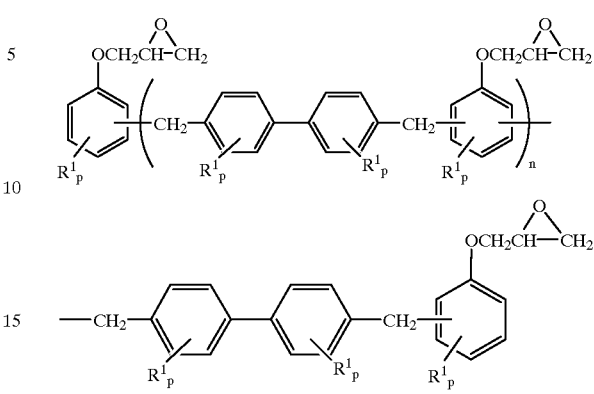

(1)

$R^1$ is hydrogen, alkyl of 1 to 4 carbon atoms, or phenyl, p is an integer of 1 to 4, and n is an integer of 0 to 10.

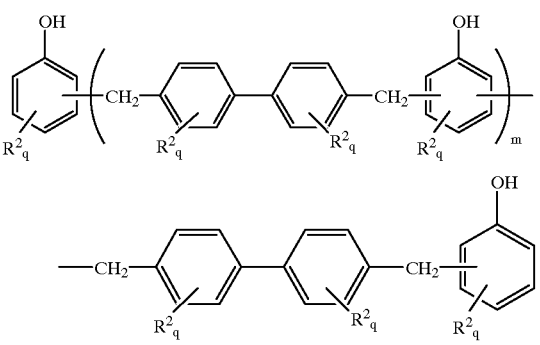

(2)

$R^2$ is hydrogen, alkyl of 1 to 4 carbon atoms, or phenyl, q is an integer of 1 to 4, and m is an integer of 0 to 10.

DETAILED DESCRIPTION OF THE INVENTION

Component (A) of the semiconductor encapsulating epoxy resin composition according to the invention is a biphenyl aralkyl type epoxy resin represented by formula (1).

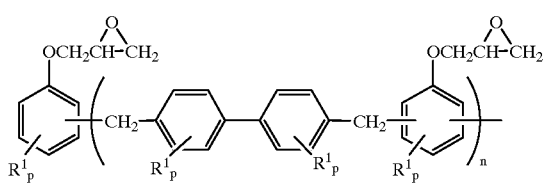

(1)

-continued

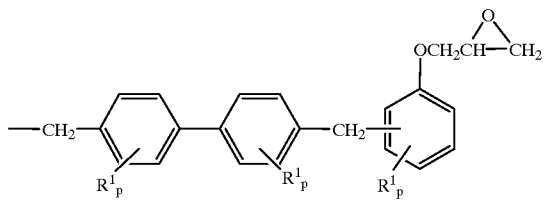

In formula (1), $R^1$ is hydrogen, alkyl of 1 to 4 carbon atoms, or phenyl, and p is an integer of 1 to 4, preferably 1 or 2. The $R^1$ groups may be the same or different. Letter n is an integer of 0 to 10, preferably 0 to 3, and more preferably 0, 1 or 2. Illustrative, non-limiting examples of the epoxy resin of formula (1) are given below.

The epoxy resin of formula (1) used as component (A) should preferably have a melt viscosity of 0.1 to 2.5 poises, more preferably 0.1 to 0.8 poise, as measured at 150° C. by a cone-and-plate type ICI viscometer. Since the semiconductor encapsulating epoxy resin composition is typically loaded with 80 to 90% by weight of an inorganic filler, an epoxy resin with a melt viscosity in excess of 2.5 poises would render the composition less flowing when melted.

In the epoxy resin composition of the invention, another epoxy resin is blended with the epoxy resin of formula (1) if necessary. Examples of the epoxy resin which can be used in combination include novolak type epoxy resins, cresol novolak type epoxy resins, triphenol alkane type epoxy resins, biphenyl type epoxy resins, heterocyclic epoxy resins, naphthalene ring-containing epoxy resins, bisphenol A type epoxy compounds, bisphenol F type epoxy compounds, and stilbene type epoxy compounds, alone and

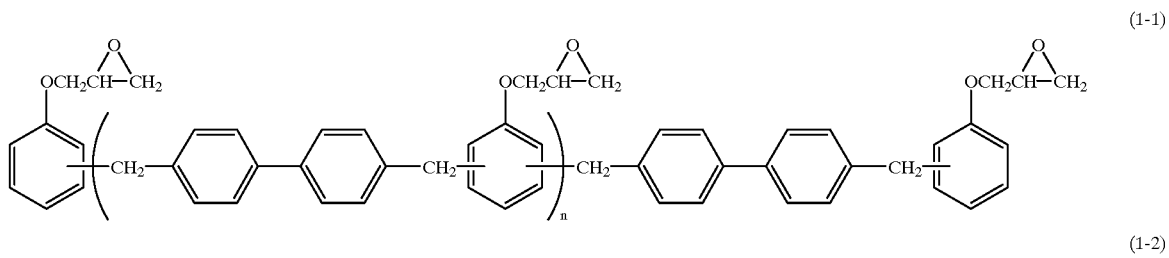
(1-1)

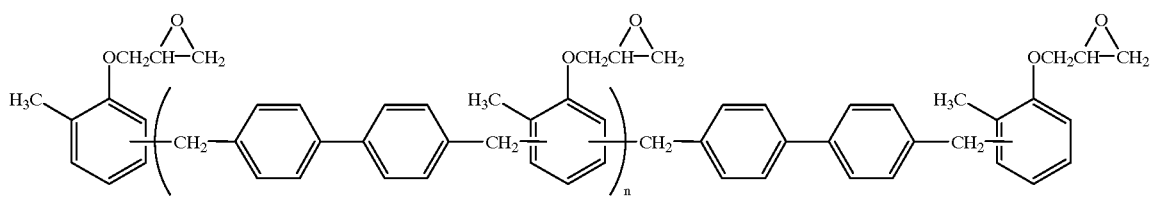
(1-2)

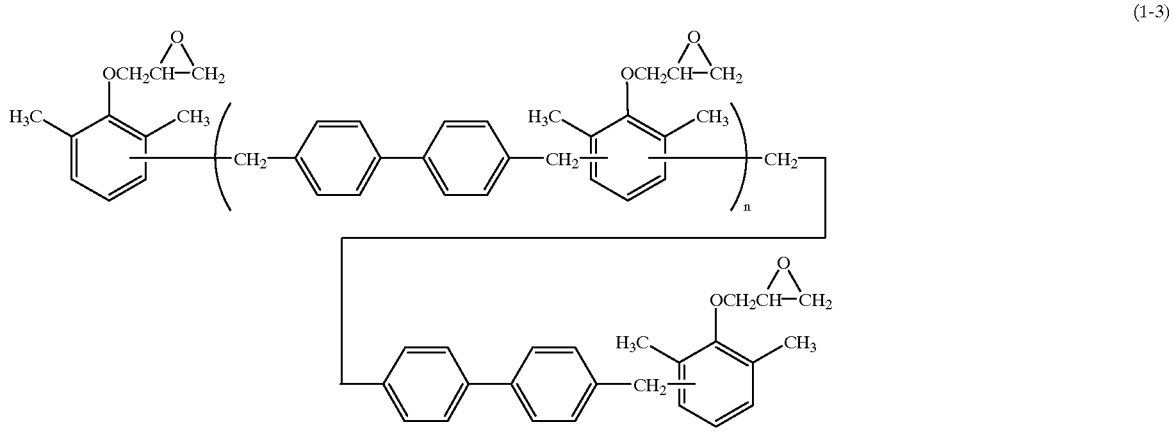
(1-3)

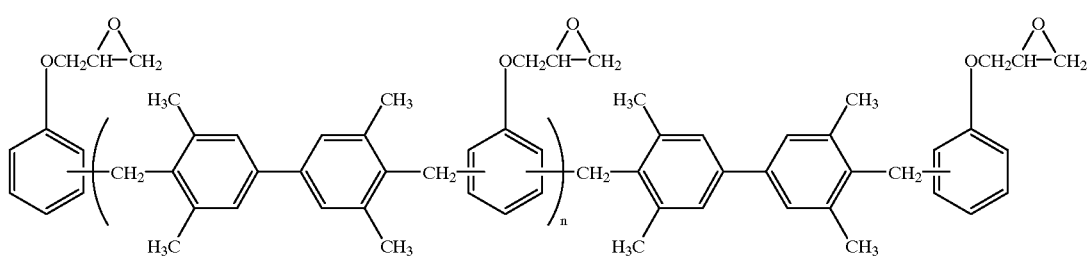
(1-4)

(In the above formulae, an integer n is as defined above.)

mixtures thereof. Of these, preferred are biphenyl type epoxy resins, bisphenol A type epoxy compounds, bisphenol F type epoxy compounds, and stilbene type epoxy compounds which show a low viscosity when melted.

The epoxy resin of formula (1) should preferably account for 50 to 100%, more preferably 70 to 100%, most preferably 80 to 100% by weight of the entire amount of epoxy resins (that is, the sum of the epoxy resin of formula (1) and other epoxy resins).

Component (B) of the semiconductor encapsulating epoxy resin composition according to the invention is a biphenyl aralkyl type phenolic resin represented by formula (2) as a curing agent.

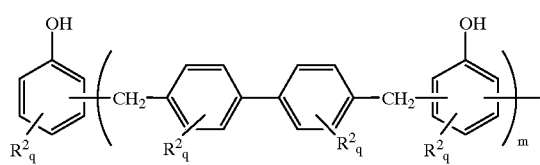

(2)

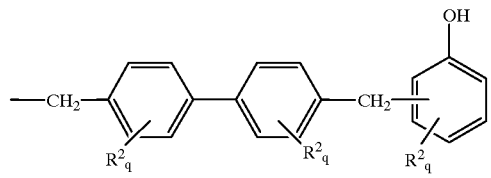

In formula (2), $R^2$ is hydrogen, alkyl of 1 to 4 carbon atoms, or phenyl, and q is an integer of 1 to 4, preferably 1 or 2. The $R^2$ groups may be the same or different. Letter m is an integer of 0 to 10, preferably 0 to 3, and more preferably 0, 1 or 2. Illustrative, non-limiting examples of the phenolic resin of formula (2) are given below.

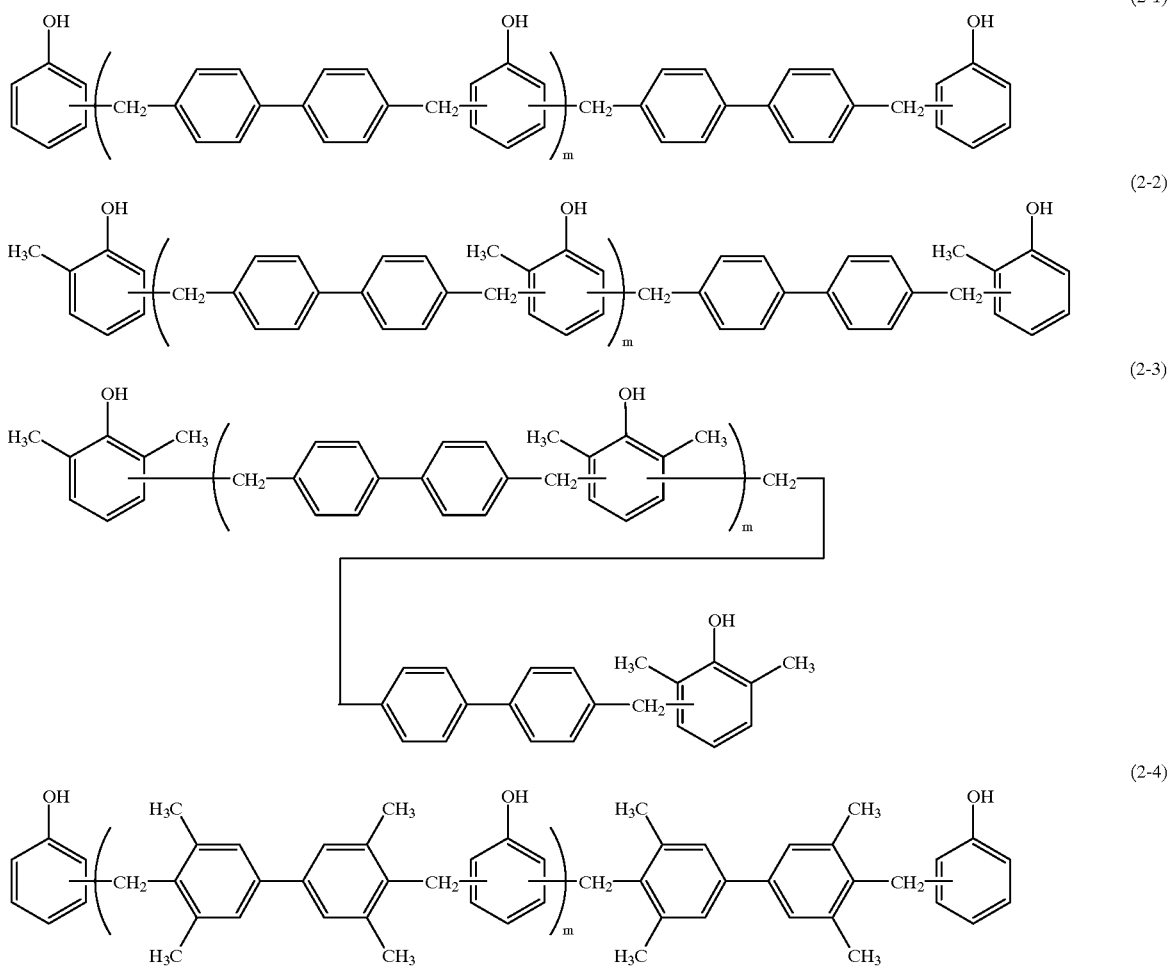

(In the above formulae, an integer m is as defined above.)

The phenolic resin of formula (2) as curing agent (B) should preferably have a melt viscosity of 0.1 to 1.2 poises as measured at 150° C. by a cone-and-plate type ICI viscometer. The reason is the same as described above for the epoxy resin.

If desired, another curing agent may be used in combination with the phenolic resin of formula (2). Examples of the other curing agent include phenol novolak resins, naphthalene ring-containing phenolic resins, phenol aralkyl type phenolic resins, biphenyl type phenolic resins, alicyclic phenolic resins, heterocyclic phenolic resins, bisphenol A type phenolic resins, and bisphenol F type phenolic resins, alone and mixtures thereof.

The phenolic resin curing agent of formula (2) should preferably account for 50 to 100%, more preferably 70 to 100%, most preferably 80 to 100% by weight of the entire amount of curing agents (that is, the sum of the phenolic resin of formula (2) and other curing agents).

The concurrent use of the epoxy resin of formula (1) and the phenolic resin curing agent of formula (2) is essential in the invention. When the epoxy resin of formula (1—1) is used in an amount of at least 50%, desirably at least 80% by weight of the epoxy resin component and the phenolic resin of formula (2–1) is used in an amount of at least 50%, desirably at least 80% by weight of the curing agent component, the resulting composition acquires the flame retardant rating of UL-94 V-0 even though it does not contain halogenated resins and antimony trioxide. When the epoxy resin of formula (1–2), (1–3) or (1–4) and the phenolic resin of formula (2—2), (2–3) or (2–4) are used in amounts of at least 50% of the respective components, the resulting compositions are rather combustible due to the increased number of methyl substituents. In order to acquire flame retardance without adding halogenated resins and antimony trioxide, the content of methyl groups should preferably be up to 5.5% (i.e., 0 to 5.5%) by weight of the total weight of the epoxy and phenolic resins.

The blending proportion of the epoxy resin and the curing agent is not critical although they are preferably blended such that 0.5 to 1.5 mol of phenolic hydroxyl groups in the curing agent are present per mol of epoxy groups in the epoxy resin.

Component (C) is an inorganic filler. The inorganic filler may be selected from among fillers which are blended in conventional epoxy resin compositions, for example, silicas such as fused silica and crystalline silica, alumina, silicon nitride, aluminum nitride, boron nitride, titanium oxide, and glass fibers. Of these, spherical fused silica and alumina are desirable, with those having a mean particle size of 5 to 30 $\mu$m being especially desirable from the molding and flowing standpoints. Note that the mean particle size is typically a weight mean diameter or median diameter as measured by laser light diffractometry. The amount of inorganic filler used is preferably at least about 400 parts by weight per 100 parts by weight of the combined amount of the epoxy resin and curing agent for satisfying both flame retardance and reflow crack resistance. Especially for rendering the composition flame retardant without adding halogenated resins and antimony trioxide, the amount of inorganic filler used is preferably about 700 to 1,100 parts by weight per 100 parts by weight of the combined amount of the epoxy resin and curing agent (i.e., the phenolic resin). Compositions loaded with less than 700 parts of the inorganic filler on this basis can be combustible. Compositions loaded with more than 1,100 parts of the inorganic filler would be too viscous to mold. It is also preferable to blend the inorganic filler which has been surface treated with a silane coupling agent or the like because the bond strength between the resin and the inorganic filler surface is enhanced. The type and amount of the coupling agent and the surface treating method are not particularly limited.

In the epoxy resin composition of the invention, a curing accelerator may be blended. It may be any of the compounds that promote reaction of epoxy groups with functional groups (i.e., phenolic hydroxyl groups) in the curing agent. Curing accelerators used in conventional encapsulating materials are also useful herein. Examples include amine compounds, typically cycloamidine compounds such as 1,8-diazabicyclo(5.4.0)undecene-7, imidazole compounds such as 2-methylimidazole and 2-ethyl-4-methylimidazole, organic phosphorus compounds such as triphenylphosphine, tris(alkylphenyl)phosphines, tris(alkoxyphenyl)phosphines, tetraphenylphosphonium tetraphenylborate, and 1,4-bis (diphenylphosphino)butane. These curing accelerators may be used alone or in admixture of two or more. The amount of the curing accelerator added is not critical although an appropriate amount is 0 to 5 parts, especially 0.01 to 2 parts by weight per 100 parts by weight of the epoxy resin and the curing agent combined. Less than 0.01 part of the curing accelerator would be insufficient to promote curing reaction, sometimes exacerbating mold release. More than 5 parts of the curing accelerator would increase the viscosity of the composition during molding and exacerbate reliability in terms of moisture proofness.

While the epoxy resin of formula (1), the phenolic resin curing agent of formula (2) and the inorganic filler are essential in the encapsulating resin composition of the invention, various additives are blended therein if necessary. Useful additives which can be blended herein include stress-reducing agents such as thermoplastic resins, thermoplastic elastomers, organic synthetic rubbers, and silicone resins, releasing agents such as waxes (e.g., carnauba wax), coloring agents such as carbon black, and halogen trapping agents.

The encapsulating resin composition of the invention is generally prepared as a molding material, for example, by blending the epoxy resin, curing agent, filler and other additives in a predetermined compositional ratio, thoroughly mixing them in a mixer, melting milling the mixture in a heat roll mill, kneader, or extruder, cooling the mixture for solidification, and grinding to fragments of suitable size.

The encapsulating resin composition thus obtained is effectively utilized for the encapsulation of a variety of semiconductor devices. Low-pressure transfer molding is the most common encapsulating technique. Desirably, the encapsulating resin composition of the invention is molded at a temperature of 150 to 185° C. for 30 to 180 seconds and post cured at 150 to 185° C. for 2 to 20 hours.

Since an epoxy resin of a specific structure and a phenolic resin of a specific structure are blended with an inorganic filler, the encapsulating resin composition of the invention is effectively moldable and forms cured parts having improved flame retardance, reflow crack resistance and good dielectric properties.

EXAMPLE

Examples of the invention are given below by way of illustration and not by way of limitation. All parts are by weight.

Examples 1–12 & Comparative Examples 1–4

The ingredients shown in Tables 1 and 2 were uniformly melt mixed in a hot twin-roll mill, cooled and ground, obtaining semiconductor encapsulating epoxy resin compositions. For a heat resistance test, each molding material thus obtained was formed into a tablet and molded into a specimen of 127×12.7×1.6 mm by a low-pressure transfer molding machine under conditions: 175° C., 70 kgf/cm$^2$, and 120 seconds. Also, for a reflow crack resistance test, each molding material was molded into a flat package of 14×20× 2.7 mm. The test results are shown in Tables 3 and 4. The ingredients used herein are shown below.

Epoxy resin (a) Epoxy resin of formula (1—1): NC3000P (Nippon Kayaku K.K., epoxy equivalent 272, ICI melt viscosity 0.8 poise at 150° C.)
(b) Epoxy resin of formula (1—1): NC3000P (Nippon Kayaku K.K., epoxy equivalent 278, ICI melt viscosity 2.5 poises at 150° C.)
(c) Epoxy resin of formula (1—1): NC3000P (Nippon Kayaku K.K., epoxy equivalent 278, ICI melt viscosity 3.0 poises at 150° C.)
(d) Epoxy resin of formula (1–2) (Nippon Kayaku K.K., epoxy equivalent 290, ICI melt viscosity 1.6 poises at 150° C.)
(e) Epoxy resin of formula (1–3) (Nippon Kayaku K.K., epoxy equivalent 300, ICI melt viscosity 2.8 poises at 150° C.)
(f) Biphenyl type epoxy resin: YX4000HK (Yuka Shell K.K., epoxy equivalent 190, ICI melt viscosity 0.8 poise at 150° C.)

Phenolic resin (g) Phenolic resin of formula (2–1): MEH7851L (Meiwa Chemicals K.K., phenol equivalent 199, ICI melt viscosity 0.8 poise at 150° C.)
(h) Phenolic resin of formula (2—2) (Meiwa Chemicals K.K., phenol equivalent 180, ICI melt viscosity 1.2 poises at 150° C.)
(i) Phenol aralkyl resin: MEH7800SS (Meiwa Chemicals K.K., phenol equivalent 175, ICI melt viscosity 1.0 poise at 150° C.)
Inorganic filler: spherical fused silica
Curing accelerator: triphenylphosphine
Carbon black
Releasing agent: carnauba wax (Nikko Fine Products K.K.)
Ion trapping agent: KW2200 (Kyowa Chemical Industry K.K.)
Silane coupling agent (γ-glycidoxypropyltrimethoxysilane): KBM403 (Shin-Etsu Chemical Industry Co., Ltd.)
Antimony trioxide: $Sb_2O_3RX$ (Sumitomo Metal Mining K.K.)
Brominated epoxy resin: AER8049 (Asahi-Ciba K.K.)

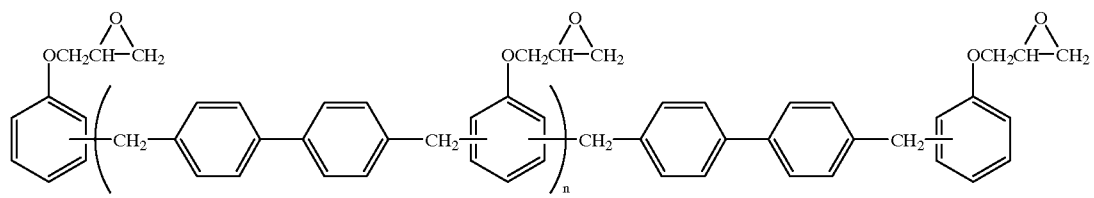

(1-1)

n is such a number as to give the epoxy equivalent of (a), (b) or (c)

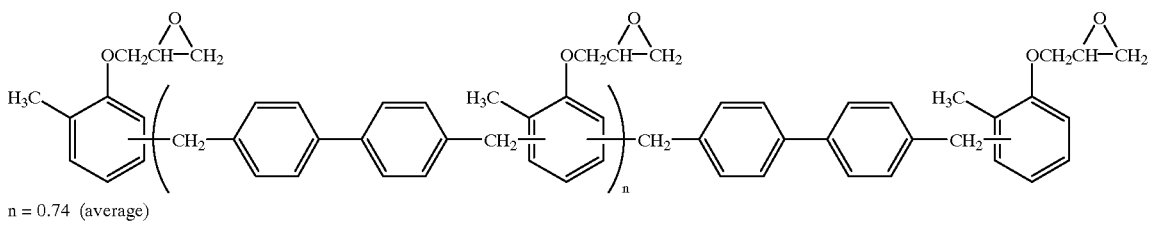

(1-2)

n = 0.74 (average)

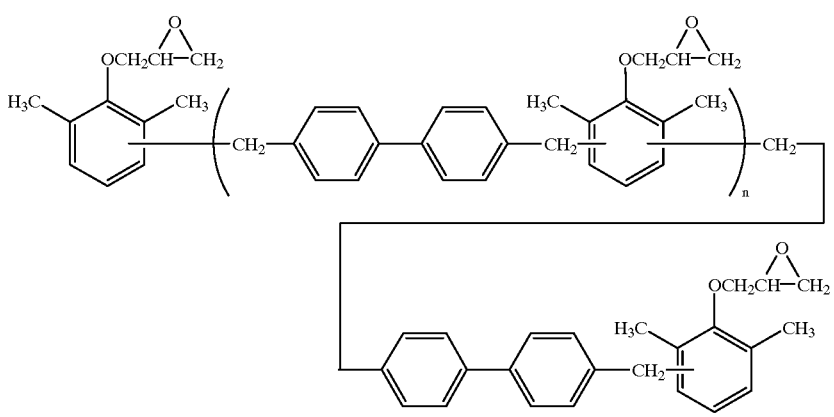

(1-3)

n = 0.62 (average)

-continued

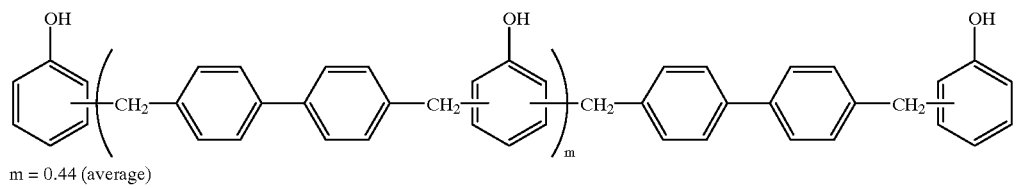

(2-1)

m = 0.44 (average)

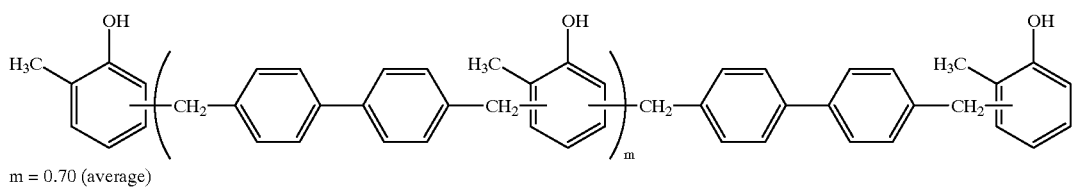

(2-2)

m = 0.70 (average)

The samples were measured for various properties by the following tests.

(1) Spiral flow

Using a mold as prescribed by the EMMI standard, spiral flow was measured under conditions: 175° C., 70 kgf/cm$^2$, and a molding time of 90 seconds.

(2) Flame resistance test

A test bar of 1/16 inch thick was subjected to the vertical test procedure set forth in Underwriters' Laboratories, Inc. Bulletin 94, Burning test for classifying materials (UL-94).

(3) Reflow cracking

A flat package of 14×20×2.7 mm was molded and post cured at 180° C. for 4 hours. It was allowed to stand in a constant temperature/humidity container at 85° C. and RH 85% for 168 hours for water absorption and then dipped in a solder bath at 240° C. for 30 seconds. The package surface was observed for cracks.

(4) Dielectric constant

A specimen molded under conditions: 175° C., 70 kgf/cm$^2$, and a molding time of 120 seconds was measured for dielectric constant at 1 MHz according to JIS K6911.

(5) High-temperature exposure resistance

A simulating element having aluminum wiring on a silicon chip and a partially gold-plated 42-alloy lead frame were bonded with a gold wire of 30 μm diameter. The assembly was encapsulated with an epoxy resin composition by molding at 175° C. and 70 kgf/cm$^2$ for 120 seconds, obtaining a 14-pin DIP. The package was post cured at 180° C. for 4 hours and allowed to stand in a drier at 200° C. for a preselected time (168, 336, 512 and 1000 hours). After the cured resin was dissolved away in fuming nitric acid, the bonded portions on the chip side were measured for tensile strength. Those samples whose tensile strength after high-temperature exposure was less than 50% of the initial value were rated defective.

(6) Internal voids

Using an automatic molding machine, a flat package of 14×20×2.7 mm was molded at 175° C. under a pressure of 70 kgf/cm$^2$. Using a ultrasonic flaw detector, the number of internal voids in the molded package was counted.

TABLE 1

| Composition (pbw) | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Epoxy resin | | | | | | | | | | | | |
| (a) | 52.66 | 52.66 | 52.66 | 52.66 | 47.14 | 36.91 | 26.62 | — | 47.64 | 40.13 | — | — |
| (b) | — | — | — | — | — | — | — | — | — | — | 52.50 | — |
| (c) | — | — | — | — | — | — | — | — | — | — | — | — |
| (d) | — | — | — | — | 5.24 | 15.88 | 26.62 | 50.11 | — | — | — | 27.12 |
| (e) | — | — | — | — | — | — | — | — | 5.29 | — | — | 27.12 |
| (f) | — | — | — | — | — | — | — | — | — | 10.03 | — | — |
| Phenolic resin | | | | | | | | | | | | |
| (g) | 47.34 | 47.34 | 47.34 | 47.34 | 47.62 | 47.27 | 48.86 | 43.69 | 42.36 | 49.84 | 47.50 | 45.76 |
| (h) | — | — | — | — | — | — | — | 4.71 | — | — | — | — |

TABLE 1-continued

| Composition (pbw) | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| (i) | — | — | — | — | — | — | — | — | — | — | — | — |
| Inorganic filler | 800 | 750 | 1000 | 600 | 800 | 800 | 800 | 800 | 800 | 800 | 800 | 800 |
| Curing accelerator | 1.2 | 1.2 | 1.2 | 1.2 | 1.2 | 1.2 | 1.2 | 1.2 | 1.2 | 1.2 | 1.2 | 1.2 |
| Carbon black | 2 | 2 | 2 | 2 | 2 | 2 | 2 | 2 | 2 | 2 | 2 | 2 |
| Releasing agent | 3 | 3 | 3 | 3 | 3 | 3 | 3 | 3 | 3 | 3 | 3 | 3 |
| Ion trapping agent | 3 | 3 | 3 | 3 | 3 | 3 | 3 | 3 | 3 | 3 | 3 | 3 |
| Silane coupling agent | 1 | 1 | 1 | 1 | 1 | 1 | 1 | 1 | 1 | 1 | 1 | 1 |
| Brominated epoxy resin | 0 | 0 | 0 | 6.20 | 0 | 0 | 0 | 6.20 | 0 | 0 | 0 | 6.20 |
| Antimony trioxide | 0 | 0 | 0 | 10 | 0 | 0 | 0 | 10 | 0 | 0 | 0 | 10 |

TABLE 2

| Composition (pbw) | Comparative Example | | | |
|---|---|---|---|---|
| | 1 | 2 | 3 | 4 |
| Epoxy resin | | | | |
| (a) | — | 39.15 | — | — |
| (b) | — | — | — | — |
| (c) | — | — | — | — |
| (d) | — | — | — | — |
| (e) | — | — | — | — |
| (f) | 51.16 | — | 52.60 | 52.60 |
| Phenolic resin | | | | |
| (g) | 48.86 | — | — | — |
| (h) | — | — | — | — |
| (i) | — | 60.85 | 47.40 | 47.40 |
| Inorganic filler | 800 | 800 | 800 | 800 |
| Curing accelerator | 1.2 | 1.2 | 1.2 | 1.2 |
| Carbon black | 2 | 2 | 2 | 2 |
| Releasing agent | 3 | 3 | 3 | 3 |
| Ion trapping agent | 3 | 3 | 3 | 3 |
| Silane coupling agent | 1 | 1 | 1 | 1 |
| Brominated epoxy resin | 0 | 0 | 0 | 6.20 |
| Antimony trioxide | 0 | 0 | 0 | 10 |

TABLE 3

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Spiral flow (cm) | 60 | 75 | 40 | 95 | 65 | 70 | 80 | 90 | 65 | 100 | 40 | 75 |
| Flame retardance | V-0 | V-0 | V-0 | V-0 | V-0 | V-0 | V-0 | V-0 | V-0 | V-0 | V-0 | V-0 |
| Reflow cracking | 0/8 | 0/8 | 0/20 | 0/8 | 0/8 | 0/8 | 0/8 | 0/8 | 0/8 | 0/8 | 0/8 | 0/8 |
| Dielectric constant | 3.7 | 3.6 | 3.8 | 3.6 | 3.6 | 3.6 | 3.7 | 3.7 | 3.6 | 3.8 | 3.6 | 3.7 |
| High-temperature | | | | | | | | | | | | |

TABLE 3-continued

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| exposure | | | | | | | | | | | | |
| 168 hr. | 0/20 | 0/20 | 0/20 | 0/20 | 0/20 | 0/20 | 0/20 | 0/20 | 0/20 | 0/20 | 0/20 | 0/20 |
| 336 hr. | 0/20 | 0/20 | 0/20 | 0/20 | 0/20 | 0/20 | 0/20 | 0/20 | 0/20 | 0/20 | 0/20 | 0/20 |
| 512 hr. | 0/20 | 0/20 | 0/20 | 0/20 | 0/20 | 0/20 | 0/20 | 0/20 | 0/20 | 0/20 | 0/20 | 0/20 |
| 1000 hr. | 0/20 | 0/20 | 0/20 | 0/20 | 0/20 | 0/20 | 0/20 | 0/20 | 0/20 | 0/20 | 0/20 | 0/20 |
| Internal voids | 0/24 | 0/24 | 0/24 | 0/24 | 0/24 | 0/24 | 0/24 | 1/24 | 3/24 | 1/24 | 3/24 | 3/24 |

TABLE 4

| | Comparative Example | | | |
|---|---|---|---|---|
| | 1 | 2 | 3 | 4 |
| Spiral flow (cm) | 115 | 75 | 130 | 125 |
| Flame retardance | burned | burned | burned | V-0 |
| Reflow cracking | 0/8 | 4/8 | 0/8 | 0/8 |
| Dielectric constant | 3.8 | 3.8 | 4.0 | 4.0 |
| High-temperature exposure | | | | |
| 168 hr. | 0/20 | 0/20 | 0/20 | 20/20 |
| 336 hr. | 0/20 | 0/20 | 0/20 | 20/20 |
| 512 hr. | 0/20 | 0/20 | 0/20 | 20/20 |
| 1000 hr. | 0/20 | 0/20 | 0/20 | 20/20 |
| Internal voids | 24/24 | 10/24 | 24/24 | 24/24 |

As is evident from the above Tables, compositions comprising an epoxy resin of a specific structure and a phenolic resin of a specific structure within the scope of the invention are effectively moldable and cure into products having improved flame retardance, reflow crack resistance and dielectric properties.

Japanese Patent Application No. 325226/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A semiconductor encapsulating epoxy resin composition comprising, (A) an epoxy resin of formula (1), having a melt viscosity of 0.1 to 2.5 poises as measured at 150° C. by a cone-and-plate type ICI viscometer:

(1)

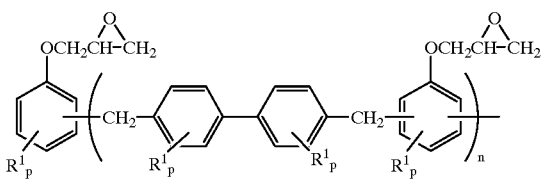

-continued

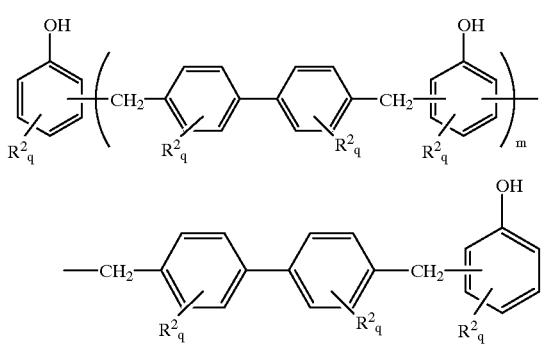

wherein $R^1$ is hydrogen, alkyl of 1 to 4 carbon atoms, or phenyl, p is an integer of 1 to 4, and n is an integer of 0 to 10, (B) a phenolic resin of formula (2):

(2)

wherein $R^2$ is hydrogen, alkyl of 1 to 4 carbon atoms, or phenyl, q is an integer of 1 to 4, and m is an integer of 0 to 10, and (C) an inorganic filler.

2. The epoxy resin composition of claim 1 wherein the epoxy resin of formula (1) has a melt viscosity of 0.1 to 0.8 poises as measure at 150° C. by a cone-and-plate type ICI viscometer.

3. The epoxy resin composition of claim 1 wherein the phenolic resin of formula (2) has a melt viscosity of 0.1 to 1.2 poises as measured at 150° C. by a cone-and-plate type ICI viscometer.

4. A semiconductor device encapsulated with the cured produce of the epoxy resin composition of claim 1.

5. A semiconductor encapsulating epoxy resin composition comprising as essential components, (A) an epoxy resin of formula (1):

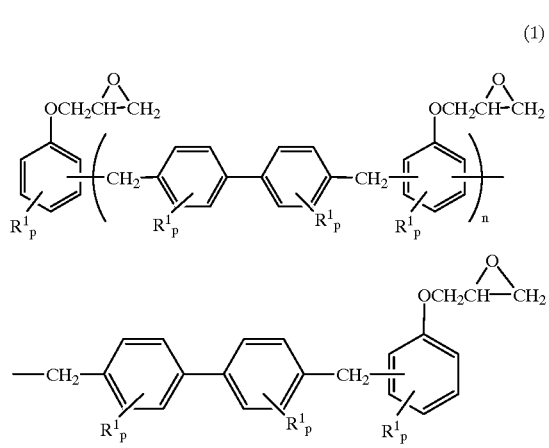

wherein $R^1$ is hydrogen, alkyl of 1 to 4 carbon atoms, or phenyl, p is an integer of 1 to 4, and n is an integer of 0 to 10, (B) a phenolic resin of formula (2):

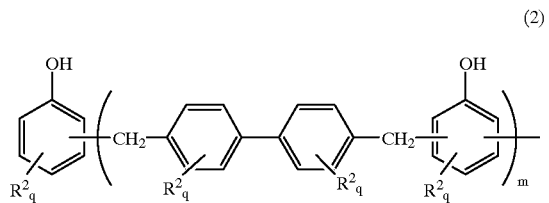

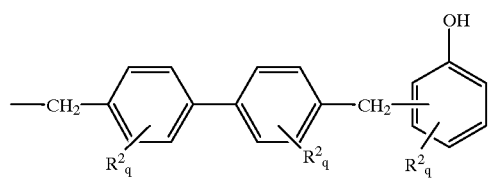

wherein $R^2$ is hydrogen, alkyl of 1 to 4 carbon atoms, or phenyl, q is an integer of 1 to 4, and m is an integer of 0 to 10, and (C) an inorganic filler.

6. The epoxy resin composition of claim 5, wherein the phenolic resin of formula (2) has a melt viscosity of 0.1 to 1.2 poises as measured at 150° C. by a cone-and-plate type ICI viscometer.

7. The epoxy resin composition of claim 1, wherein p is 1 or 2 and n is 0 to 3.

8. The epoxy resin composition of claim 1, wherein the epoxy resin of formula (1) is

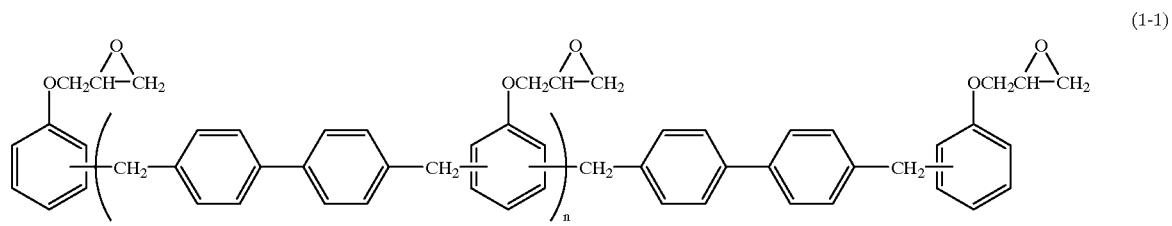

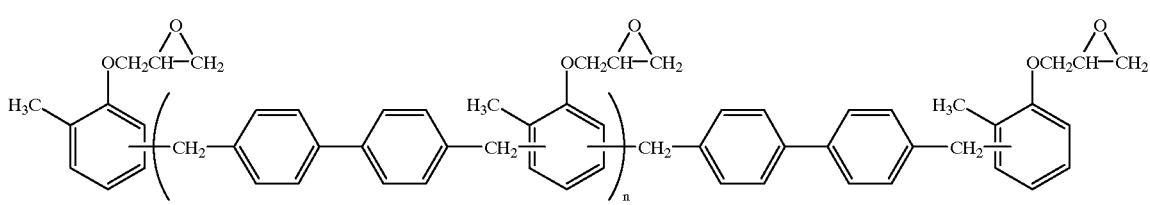

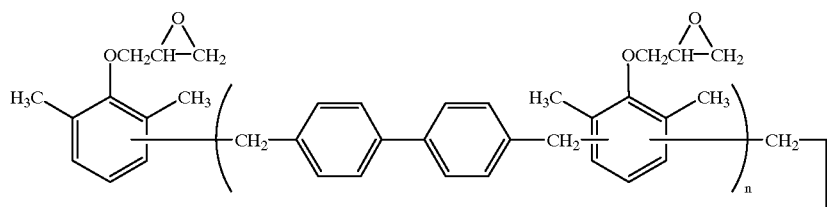

(1-3)

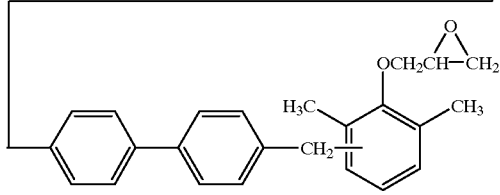

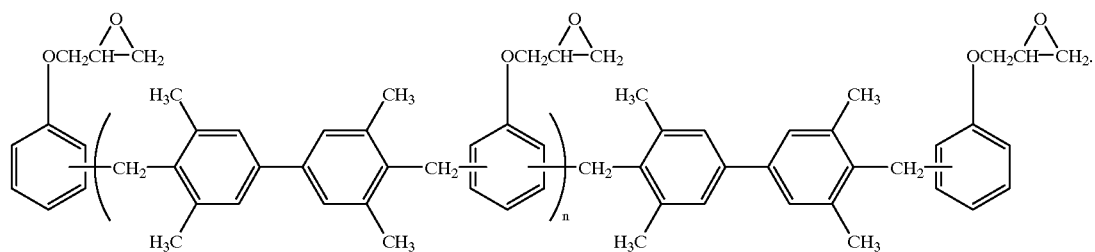

(1-4)

9. The epoxy resin composition of claim 1, wherein the epoxy resin of formula (1) is blended with at least one novolak epoxy resin, cresol novolak epoxy resin, triphenol alkane epoxy resin, biphenyl epoxy resin, heterocyclic epoxy resin, naphthalene ring-containing epoxy resin, bisphenol A epoxy resin, bisphenol F epoxy resin, or stilbene epoxy resin.

10. The epoxy resin composition of claim 1, wherein the epoxy resin of formula (1) is blended with at least one biphenyl epoxy resin, bisphenol A epoxy resin, bisphenol F epoxy resin, or stilbene epoxy resin.

11. The epoxy resin composition of claim 1, containing 50 to 100% of the epoxy resin of formula (1).

12. The epoxy resin composition of claim 1, containing 70 to 100% of the epoxy resin of formula (1).

13. The epoxy resin composition of claim 1, containing 80 to 100% of the epoxy resin of formula (1).

14. The epoxy resin composition of claim 1, wherein the phenolic resin of formula (2) is

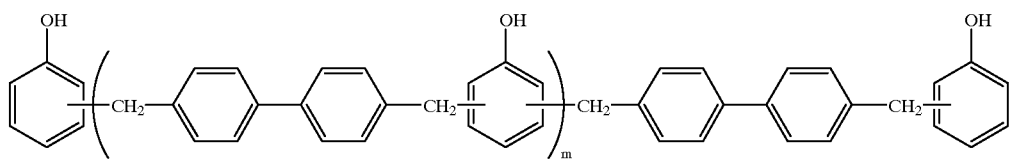

(2-1)

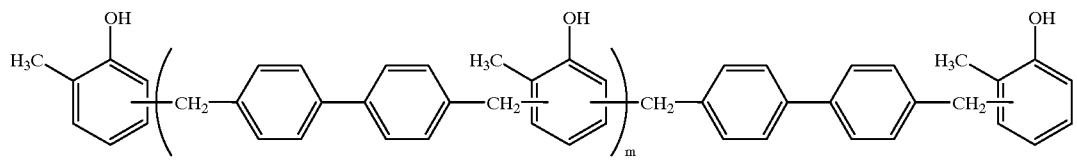

(2-2)

-continued

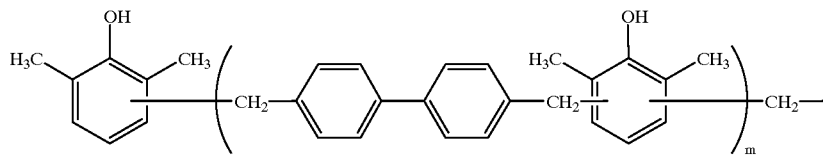

(2-3)

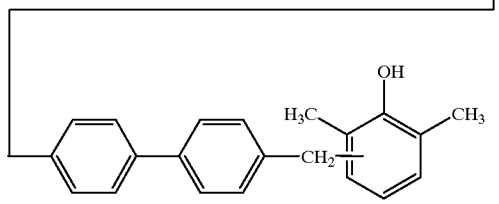

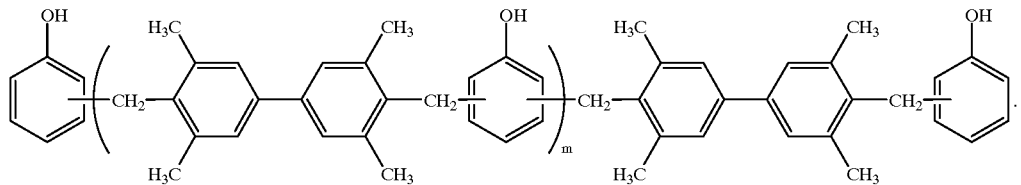

(2-4)

15. The epoxy resin composition of claim 1, wherein the phenolic resin of formula (2) is blended with at least one additional curing agent which is at least one phenol novolak resin, naphthalene ring-containing phenolic resin, phenol aralkyl phenolic resin, biphenyl phenolic resin, alicyclic phenolic resin, heterocyclic phenolic resin, bisphenol A phenolic resin, or bisphenol F phenolic resin.

16. The epoxy resin composition of claim 15, wherein the phenolic resin of formula (2) is present in an amount of at least 50% by weight of all curing agent.

17. The epoxy resin composition of claim 1, containing up to 5.5% by weight of methyl groups based on total weight of epoxy and phenolic resins.

18. A cured product, produced by curing the epoxy resin composition of claim 1.

19. A process for producing a cured resin product, comprising subjecting the epoxy resin composition of claim 1 to curing conditions.

20. A process for producing an encapsulated semiconductor device, comprising subjecting to curing conditions a semiconductor device coated with the epoxy resin composition of claim 1.

* * * * *